US009142730B2

United States Patent
Han et al.

(10) Patent No.: US 9,142,730 B2
(45) Date of Patent: Sep. 22, 2015

(54) METHOD OF MANUFACTURING SEMICONDUCTOR LIGHT EMITTING DEVICE

(71) Applicant: SAMSUNG ELECTRONICS CO., LTD., Suwon-si, Gyeonggi-do (KR)

(72) Inventors: Jae Ho Han, Hwaseong-si (KR); Myeong Ha Kim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/285,102

(22) Filed: May 22, 2014

(65) Prior Publication Data

US 2015/0087096 A1  Mar. 26, 2015

(30) Foreign Application Priority Data

Sep. 25, 2013  (KR) .................. 10-2013-0113896

(51) Int. Cl.
| | |
|---|---|
| *H01L 33/22* | (2010.01) |
| *H01L 33/42* | (2010.01) |
| *H01L 33/40* | (2010.01) |
| *H01L 31/0236* | (2006.01) |

(52) U.S. Cl.
CPC .......... *H01L 33/42* (2013.01); *H01L 31/02366* (2013.01); *H01L 33/22* (2013.01); *H01L 33/405* (2013.01)

(58) Field of Classification Search
CPC ................. H01L 21/02365; H01L 21/02518; H01L 21/20
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |

(Continued)

FOREIGN PATENT DOCUMENTS

| | | |
|---|---|---|
| KR | 10-0650996 B1 | 11/2006 |
| KR | 10-0814463 B1 | 3/2008 |

(Continued)

*Primary Examiner* — Cheung Lee
(74) *Attorney, Agent, or Firm* — McDermott Will & Emery LLP

(57) ABSTRACT

A method of manufacturing a semiconductor light emitting device is performed on a light emitting structure including a sequential stack of a first conductivity-type semiconductor layer, an active layer, and a second conductivity-type semiconductor layer. The second conductivity-type semiconductor layer and the active layer are mesa-etched to expose a portion of the first conductivity-type semiconductor layer therethrough. A conductive layer is formed on the second conductivity-type semiconductor layer and the portion of the first conductivity-type semiconductor layer exposed by mesa-etching. In turn, the conductive layer is dry etched such that an upper surface of the first conductivity-type semiconductor layer is partially etched to have uneven portions formed thereon. The resulting semiconductor light emitting device has improved external light extraction efficiency while being easily manufactured.

20 Claims, 18 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,714,337 B2 | 5/2010 | Kim et al. |
| 7,759,140 B2 | 7/2010 | Lee et al. |
| 7,781,727 B2 | 8/2010 | Sherrer et al. |
| 7,781,755 B2 | 8/2010 | Sung et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,314,437 B2 | 11/2012 | Zaima et al. |
| 8,324,646 B2 | 12/2012 | Lee et al. |
| 8,399,944 B2 | 3/2013 | Kwak et al. |
| 8,415,700 B2 | 4/2013 | Jeong |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2012/0062726 A1 | 3/2012 | Hsieh et al. |
| 2013/0049006 A1 | 2/2013 | Hu |

FOREIGN PATENT DOCUMENTS

| | | |
|---|---|---|
| KR | 10-1025980 B1 | 3/2011 |
| KR | 10-1028345 B1 | 4/2011 |
| KR | 10-2011-0103687 A | 9/2011 |
| KR | 10-2012-0030129 A | 3/2012 |
| KR | 10-1123009 B1 | 3/2012 |
| KR | 10-1138973 B1 | 4/2012 |
| KR | 10-2013-0009399 A | 1/2013 |
| KR | 10-2013-0022633 A | 3/2013 |
| WO | 2013/012194 A2 | 1/2013 |

METHOD OF MANUFACTURING SEMICONDUCTOR LIGHT EMITTING DEVICE

CROSS-REFERENCE TO RELATED APPLICATION

This application claims the benefit of Korean Patent Application No. 10-2013-0113896 filed on Sep. 25, 2013, with the Korean Intellectual Property Office, the disclosure of which is incorporated herein by reference.

BACKGROUND

The present disclosure relates to a method of manufacturing a semiconductor light emitting device.

In general, a light emitting diode (LED), a type of semiconductor light emitting device, is a semiconductor device capable of generating light of various colors due to the recombination of electrons and holes therein. A demand for such semiconductor light emitting devices has been continuously increasing, since they have various advantages such as a relatively long lifespan, low power consumption, superior initial driving characteristics, and the like, as compared to filament-based light emitting devices. Accordingly, various attempts at improving characteristics of semiconductor light emitting devices have been made. In particular, a device structure capable of easily, externally emitting light generated in the light emitting device has been developed, and a method of efficiently manufacturing the same has also been developed.

SUMMARY

An aspect of the present disclosure provides a method of efficiently manufacturing a semiconductor light emitting device having improved external light extraction efficiency.

According to an aspect of the present disclosure, a method of manufacturing a semiconductor light emitting device is performed on a light emitting structure including a first conductivity-type semiconductor layer, an active layer, and a second conductivity-type semiconductor layer. The second conductivity-type semiconductor layer and the active layer are mesa-etched to expose a portion of the first conductivity-type semiconductor layer. A conductive layer is formed on the second conductivity-type semiconductor layer and on the portion of the first conductivity-type semiconductor layer exposed by mesa-etching. The conductive layer is dry etched such that an upper surface of the first conductivity-type semiconductor layer is partially etched to have uneven portions thereon.

In the dry etching of the conductive layer, dry etching may be performed on a region of the conductive layer formed on the portion of the first conductivity-type semiconductor layer in such a manner that different areas of the upper surface of the first conductivity-type semiconductor layer are selectively exposed for different periods of time to the dry etching process due to a difference in etching ratios between grains and grain boundaries forming the conductive layer.

The dry etching of the conductive layer may be performed such that the conductive layer formed on the portion of the first conductivity-type semiconductor layer is completely removed from the portion of the first conductivity-type semiconductor layer.

The method may further include disposing a dry etching mask on a region of the conductive layer formed on the second conductivity-type semiconductor layer, prior to the dry etching of the conductive layer and after the forming of the conductive layer.

The method may further include forming a passivation layer to cover a lateral surface of a mesa structure exposed by the mesa-etching, prior to the forming of the conductive layer and after the mesa-etching of the second conductivity-type semiconductor layer and the active layer.

The passivation layer may include at least one material selected from a group consisting of silicon oxide, silicon nitride, and silicon oxynitride.

The dry etching of the conductive layer may include performing a first dry etching on regions of the conductive layer formed on the second conductivity-type semiconductor layer and on the portion of the first conductivity-type semiconductor layer, and performing a second dry etching on the region of the conductive layer formed on the portion of the first conductivity-type semiconductor layer in such a manner that the upper surface of the first conductivity-type semiconductor layer is partially etched to form the uneven portions thereon.

The performing of the first dry etching may be undertaken such that a surface of the region of the conductive layer formed on the second conductivity-type semiconductor layer is partially etched to have uneven portions formed thereon, and such that the region of the conductive layer formed on the second conductivity-type semiconductor layer remains on the second conductivity-type semiconductor layer following the first dry etching.

The method may further include wet etching a region of the conductive layer formed on the portion of the first conductivity-type semiconductor layer, prior to the dry etching of the conductive layer and after the forming of the conductive layer.

The wet etching may be performed such that the conductive layer formed on the portion of the first conductivity-type semiconductor layer remains on the first conductivity-type semiconductor layer following the wet etching.

The conductive layer may be a transparent conductive oxide layer.

The conductive layer may be formed to have a thickness of about 600 Å to about 800 Å.

The conductive layer may be a reflective metal layer.

The conductive layer may be formed to have a thickness of about 20 Å to about 100 Å.

According to another aspect of the present disclosure, a method of manufacturing a semiconductor light emitting device may be performed on a light emitting structure including sequential stack of a first conductivity-type semiconductor layer, an active layer, and a second conductivity-type semiconductor layer. The light emitting structure is mesa-etched to expose a portion of the first conductivity-type semiconductor layer. A conductive polycrystalline layer is formed on the exposed portion of the first conductivity-type semiconductor layer and the second conductivity-type semiconductor layer so as to form an interface between the first conductivity-type semiconductor layer and the conductive polycrystalline layer. The conductive polycrystalline layer is dry etched such that the first conductivity-type semiconductor layer has uneven portions at the interface thereof.

According to another aspect of the present disclosure, a method of manufacturing a semiconductor light emitting device is performed a light emitting structure including a first semiconductor layer, an active layer, and a second semiconductor layer. A conductive layer, including a plurality of grains separated by grain boundaries, is formed on a surface of the light emitting structure. The conductive layer formed on the light emitting structure is dry etched to expose at least a portion of the surface of the light emitting structure, wherein areas of the exposed surface of the light emitting structure disposed near grain boundaries of the conductive layer are subject to the dry etching for a longer period of time than areas of the exposed surface of the light emitting structure disposed away from grain boundaries.

The method can further include selecting an average grain size of the conductive layer prior to forming the conductive layer, wherein the dry etching produces uneven portions on the exposed surface of the light emitting structure, and the average grain size is selected based on a desired density of the uneven portions produced on the exposed surface of the light emitting structure.

The first semiconductor layer, the active layer, and the second semiconductor layer may be sequentially stacked layers of the light emitting structure, and the dry etching of the conductive layer may include dry etching portions of the conductive layer that are formed directly on the first semiconductor layer of the light emitting structure so as to expose at least a portion of the first semiconductor layer of the light emitting structure.

The conductive layer may be formed both directly on portions of the first semiconductor layer and directly on portions of the second semiconductor layer. The dry etching of the conductive layer may include performing a first dry etching step on both portions of the conductive layer formed directly on the first semiconductor layer and portions of the conductive layer formed directly on the second semiconductor layer, and performing a second dry etching step only on portions of the semiconductor layer formed directly on the first semiconductor layer so as to expose at least part of the first semiconductor layer of the light emitting structure, wherein at least part of the conductive layer remains on the first semiconductor layer and on the second semiconductor layer following completion of the first dry etching step.

The conductive layer may be a transparent conductive oxide layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
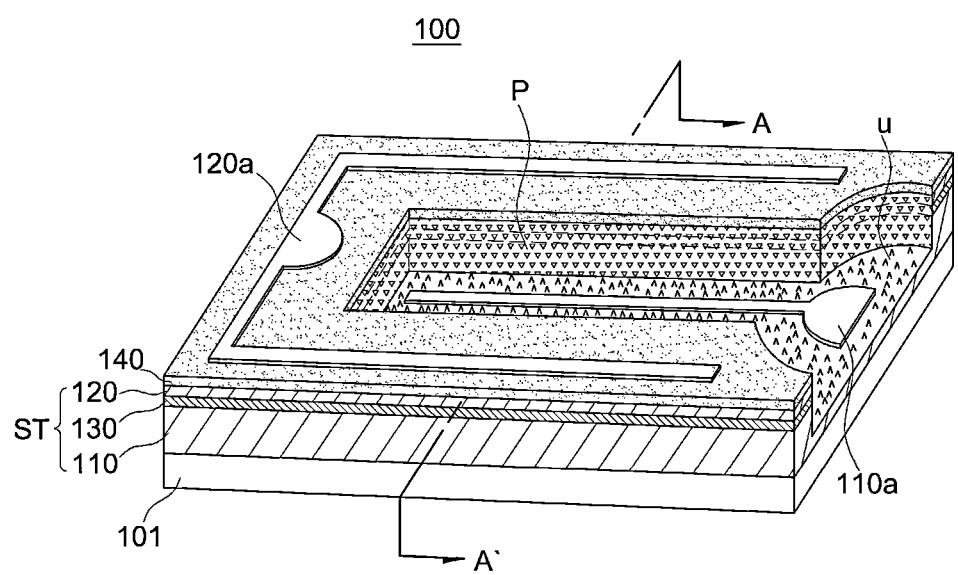
FIG. 1 is a schematic perspective view of a semiconductor light emitting device manufactured according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a schematic perspective view of a semiconductor light emitting device 100 manufactured according to an exemplary embodiment of the present disclosure. A structural characteristic of the semiconductor light emitting device 100 will be described first and then, a method of manufacturing the semiconductor light emitting device 100 will be described later.

Referring to FIG. 1, the semiconductor light emitting device 100 according to the exemplary embodiment of the present disclosure may include a light emitting structure ST disposed on a substrate 101. The light emitting structure ST may include a first conductivity-type semiconductor layer 110, an active layer 130, and a second conductivity-type semiconductor layer 120 sequentially stacked on each other. First and second electrode parts 110a and 120a may be disposed on the first and second conductivity-type semiconductor layers 110 and 120, respectively, to apply driving power thereto. For further effective current dispersion, the first and second electrode parts 110a and 120a may include at least one electrode finger (e.g., an elongated electrode structure) extended from an electrode pad, but the present disclosure is not limited thereto.

In the specification, the terms 'above', 'upper portion', 'upper surface', 'below' 'lower portion', 'lower surface', 'side surface', and the like, refer to the relative positions of elements shown in the drawings, which may be different depending on a direction in which the device or a package is actually disposed. Such positional terms are to be more generally interpreted as referring to the relative positions of elements regardless of the orientation of the underlying device or figure.

The substrate 101 may be provided as a semiconductor growth substrate. The substrate 101 may be formed of an insulating material, a conductive material, or a semiconductor material such as sapphire, SiC, $MgAl_2O_4$, MgO, $LiAlO_2$, $LiGaO_2$, GaN, or the like. In this case, sapphire may be a crystal having electrical insulating properties and Hexa-Rhombo R3c symmetry. The sapphire may have a lattice constant of 13.001 Å in a C-axis direction and a lattice constant of 4.758 Å in an A-axis direction and may include a C (0001) plane, an A (1120) plane, an R (1102) plane, and the like. In this case, the C plane can be mainly used as a nitride growth substrate because the C plane relatively facilitates the growth of a nitride film and is stable at high temperature.

Further, a silicon (Si) substrate may be suitably used as the substrate 101 by way of example. Since the Si substrate is appropriate for obtaining a substrate having a large diameter and requires relatively low manufacturing costs, mass production thereof may be enhanced. In the case of using the Si substrate, after a nucleation layer formed of a material such as $Al_xGa_{1-x}N$ is formed on the substrate 101, a nitride semiconductor having a desired structure may be grown on the nucleation layer.

The present disclosure is not limited, but in some examples a plurality of uneven portions may be formed on an upper surface of the substrate 101 that is used as a growth surface of the semiconductor layers 110, 120. Due to such uneven portions, crystalline properties of the semiconductor layers, light extraction efficiency, and the like may be improved.

In the exemplary embodiment, the light emitting structure ST may include the first conductivity-type semiconductor layer 110, the active layer 130, and the second conductivity-type semiconductor layer 120 disposed on the substrate 101. The first and second conductivity-type semiconductor layers 110 and 120 may be formed of semiconductors doped with n-type and p-type impurities, respectively, but are not limited thereto. Alternatively, the first and second conductivity-type semiconductor layers 110 and 120 may be p-type and n-type semiconductor layers, respectively. In addition, the first and second conductivity-type semiconductor layers 110 and 120 may be formed of a nitride semiconductor, for example, a material having a composition of $Al_xIn_yGa_{1-x-y}N$ ($0 \le x \le 1$, $0 \le y \le 1$, $0 \le x+y \le 1$). However, the first and second conductivity-type semiconductor layers 110 and 120 may be formed using an AlGaInP-based or an AlGaAs-based semiconductor, in addition to or instead of the nitride semiconductor.

The active layer 130 may be disposed between the first and second conductivity-type semiconductor layers 110 and 120 and emit light having a predetermined degree of energy or wavelength due to the recombination of electrons and holes. The active layer 130 may include a material having an energy band gap smaller than those of the first and second conductivity-type semiconductor layers 110 and 120. For example, when the first and second conductivity-type semiconductor layers 110 and 120 are formed of a GaN-based compound semiconductor, the active layer 130 may include an InAlGaN-based compound semiconductor having an energy band gap smaller than that of GaN. In addition, the active layer 130 may have a multiple quantum well (MQW) structure in which quantum barrier and quantum well layers are alternately stacked, for example, an InGaN/GaN structure.

In the exemplary embodiment, a conductive layer 140 may be disposed between the second conductivity-type semiconductor layer 120 and the second electrode part 120a.

The conductive layer 140 may allow a current applied from the second electrode part 120a to be effectively dispersed over the entire surface of the second conductivity-type semiconductor layer 120. The present disclosure is not limited thereto, but in a device structure in which light generated from the active layer 130 is emitted upwardly of the light emitting structure ST, the conductive layer 140 may be a transparent conductive oxide layer having high light transmissivity and relatively high ohmic contact characteristics. For example, the conductive layer 140 may be formed of at least one selected from a group consisting of ITO (Indium Tin Oxide), ZnO (Zinc oxide), ZITO (Zinc-doped Indium Tin Oxide), ZIO (Zinc Indium Oxide), CIO (Cu-doped tin oxide), GIO (Gallium Indium Oxide), ZTO (Zinc Tin Oxide), FTO (Fluorine-doped Tin Oxide), AZO (Aluminum-doped Zinc Oxide), GZO (Gallium-doped Zinc Oxide), $In_4Sn_3O_{12}$ or $Zn_{1-x}Mg_xO$ (Zinc Magnesium Oxide, $0 \le x \le 1$).

In the exemplary embodiment, the light emitting structure ST may have a mesa structure in which a portion of the second conductivity-type semiconductor layer 120 and the active layer 130 is mesa-etched and removed so as to expose a portion of the first conductivity-type semiconductor layer 110. By doing so, the portion of the first conductivity-type semiconductor layer 110 may be exposed upwardly of the light emitting structure ST, such that an upper surface thereof may be provided as a region to have the first electrode part 110 formed thereon. Meanwhile, FIG. 1 illustrates that the portion of the first conductivity-type semiconductor layer 110, exposed by mesa-etching is present in a central region of an upper surface of the light emitting structure ST, but the present disclosure is not limited thereto. For example, the region of the first conductivity-type semiconductor layer 110, exposed by mesa-etching may be an edge region, a vertex region, or the like, on the upper surface of the light emitting structure ST.

A passivation layer P may be formed on one or more lateral surfaces of the mesa structure that are exposed by mesa-etching. The passivation layer P may serve to protect the light emitting structure ST, in particular, the active layer 130 from external environments. In more detail, since the active layer 130 may be exposed to the outside as a result of the mesa-etching, and since exposed portions of the active layer 130 may function as a current leakage path during an operation of the semiconductor light emitting device 100, such a defect may be prevented by forming the passivation layer P. In addition, as described in more detail later, the passivation layer P may prevent an electrical short circuit of the device that can be generated as fragments of a material, etched in a process of etching a region of the conductive layer 140 formed on the first conductivity-type semiconductor layer 110 exposed by mesa-etching, are adhered to the lateral surface(s) of the mesa structure. The passivation layer P may be formed of an insulating material, for example, formed of at least one of silicon oxide ($SiO_2$), silicon nitride ($Si_xN_y$) and silicon oxynitride ($SiO_xN_y$).

In the exemplary embodiment, uneven portions (u) may be formed on the first conductivity-type semiconductor layer 110 exposed by mesa-etching. In general, a considerable amount of light generated in the active layer 130 may not be emitted externally from the semiconductor light emitting device due to total reflection caused by a difference between an internal refractive index of the light emitting structure ST and a refractive index of external environments (for example, the air). However, in the exemplary embodiment, since an incident angle of light at an interface between an external material (for example, the air) and the first conductivity-type semiconductor layer 110 may be variously formed due to the uneven portions (u) formed on the first conductivity-type semiconductor layer 110, light generated in the active layer 130 may be more easily externally emitted.

For example, in the case of the semiconductor light emitting device 100 illustrated in FIG. 1, even in a central region thereof in which the region of the first conductivity-type semiconductor layer 110 exposed by mesa-etching is disposed, light may be easily externally emitted due to the uneven portions.

However, the region of the first conductivity-type semiconductor layer 110 exposed by mesa-etching need not be formed in a central region of the device 100. More generally, the region of the first conductivity-type semiconductor layer 110 exposed by mesa-etching may be disposed in an edge region of the device 100, in a vertex region, or the like, on the upper surface of the light emitting structure ST.

Hereinafter, with reference to FIG. 2 and FIGS. 3A through 3F, the method of manufacturing the semiconductor light emitting device 100 described above will be described.

Figure 2:
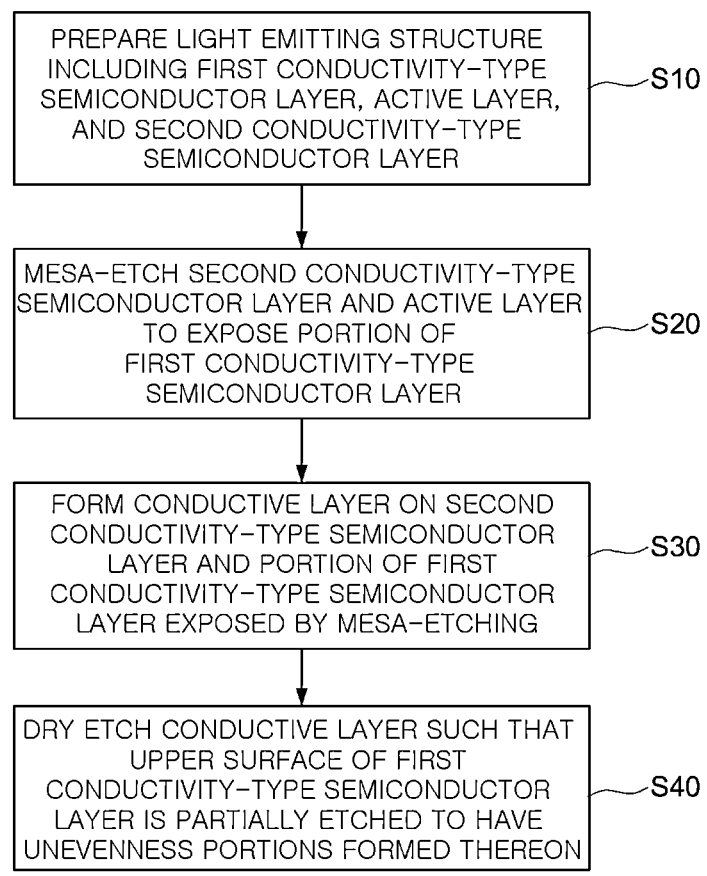
FIG. 2 is a flow chart describing steps of a method of manufacturing the semiconductor light emitting device according to the exemplary embodiment of the present disclosure.

FIG. 2 is a flow chart describing steps of a method of manufacturing the semiconductor light emitting device 100 according to the exemplary embodiment of the present disclosure. FIGS. 3A through 3F are cross-sectional views of the semiconductor light emitting device 100 according to the exemplary embodiment, taken along line A-A' of FIG. 1, in various steps of the manufacturing process.

Figure 3A:
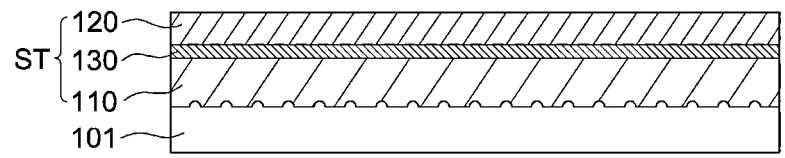
FIGS. 3A through 3F are cross-sectional views of the semiconductor light emitting device in various steps of a manufacturing process, according to the exemplary embodiment of the present disclosure.

Referring to FIG. 2 and FIG. 3A, in the method of manufacturing the semiconductor light emitting device 100 according to the exemplary embodiment, first, the light emitting structure ST including the first conductivity-type semiconductor layer 110, the active layer 130, and the second conductivity-type semiconductor layer 120 may be prepared (S10).

The first and second conductivity-type semiconductor layers 110 and 120 and the active layer 130 may be grown using a semiconductor growth process such as metal organic chemical vapor deposition (MOCVD), hydride vapor phase epitaxy (HYPE), molecular beam epitaxy (MBE), or the like.

Figure 3B:
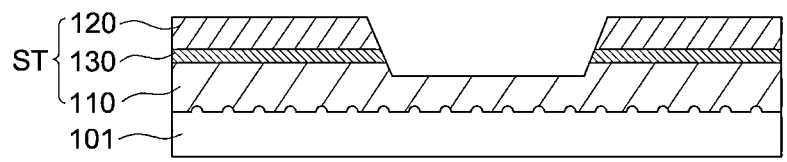

Then, as illustrated in FIG. 2 and FIG. 3B, the light emitting structure ST may be mesa-etched so as to expose a portion of the first conductivity-type semiconductor layer 110. In the exemplary embodiment, the second conductivity-type semiconductor layer 120 and the active layer 130 may be mesa-etched until at least a portion of the first conductivity-type semiconductor layer 110 is exposed (S20). Specifically, the mesa-etching results in the second conductivity-type semiconductor layer 120 and the active layer 130 being removed from the portion of the first conductivity-type semiconductor layer 110 that is exposed by the mesa-etching.

Figure 3C:
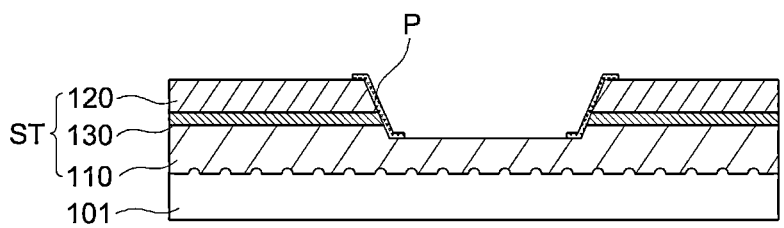

Meanwhile, as illustrated in FIG. 3C, the passivation layer P may be formed to cover the lateral surface of the mesa structure exposed by mesa-etching. The passivation layer P may include at least one material selected from a group consisting of silicon oxide, silicon nitride, and silicon oxynitride. Meanwhile, although FIG. 1 illustrates that the passivation layer P is formed to cover only the lateral surface of the mesa structure, the passivation layer P may optionally be formed to partially cover upper surfaces of the first and second conductivity-type semiconductor layers, as well as the lateral surface of the mesa structure, as illustrated in FIG. 3C.

Figure 3D:
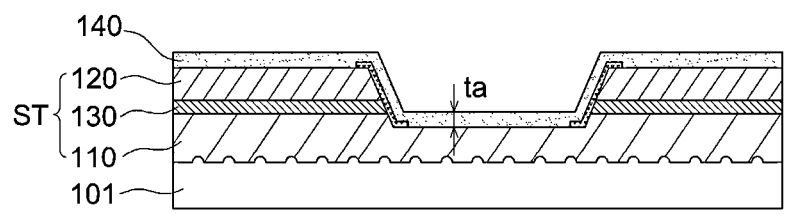

Next, as illustrated in FIG. 2 and FIG. 3D, the conductive layer 140 may be formed on the second conductivity-type semiconductor layer 120 such that a current applied to the second conductivity-type semiconductor layer 120 may be uniformly dispersed. Here, the conductive layer 140 may be formed on an entire upper surface of the structure to cover the portion of the first conductivity-type semiconductor layer 110 exposed by mesa-etching, as well as the second conductivity-type semiconductor layer 120 and the passivation layer P (S30).

In the process, the conductive layer 140 may be deposited on the entire portion of the first conductivity-type semiconductor layer 110 and the second conductivity-type semiconductor layer 120 and thereby form an interface between the conductive layer 140 and the portion of the first conductivity-type semiconductor layer 110 exposed by mesa-etching, as well as an interface between the conductive layer 140 and the second conductivity-type semiconductor layer 120. In this case, the conductive layer 140 formed on the first conductivity-type semiconductor layer 110 exposed by mesa-etching may serve as a mask pattern in forming the uneven portions (u) on the first conductivity-type semiconductor layer 110, as described later.

In the exemplary embodiment, the conductive layer 140 may be provided as a conductive material having a polycrystalline structure, and may be a transparent conductive oxide layer formed of at least one selected from a group consisting of ITO (Indium Tin Oxide), ZnO (Zinc oxide), ZITO (Zinc-doped Indium Tin Oxide), ZIO (Zinc Indium Oxide), CIO (Cu-doped tin oxide), GIO (Gallium Indium Oxide), ZTO (Zinc Tin Oxide), FTO (Fluorine-doped Tin Oxide), AZO (Aluminum-doped Zinc Oxide), GZO (Gallium-doped Zinc Oxide), $In_4Sn_3O_{12}$, or $Zn_{1-x}Mg_xO$ (Zinc Magnesium Oxide, $0 \leq x \leq 1$). However, the present disclosure is not limited thereto. For example, the conductive layer 140 may be formed of a reflective metal layer, to be described later in FIGS. 11A to 11D.

Meanwhile, in the case of employing a transparent conductive oxide layer (for example, ITO) as the conductive layer 140, the conductive layer 140 may be formed to have a thickness $t_a$ less than 2000 Å. For example, the conductive layer 140 may be formed to have a thickness $t_a$ of about 600 Å to about 800 Å.

Figure 3E:
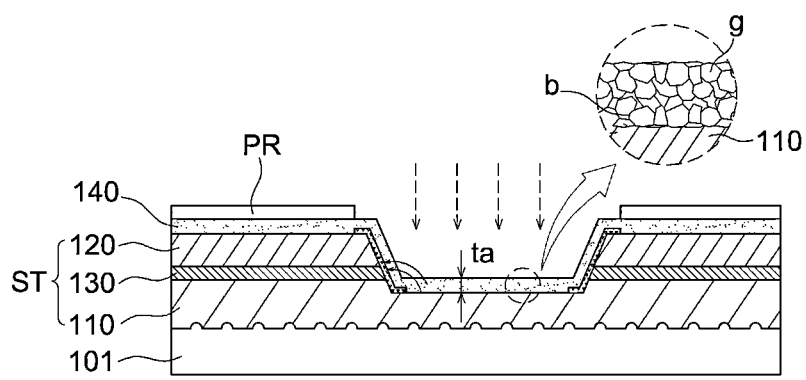

Next, as illustrated in FIG. 2 and FIG. 3E, dry etching may be performed on the region of the conductive layer 140 formed on the portion of the first conductivity-type semiconductor layer 110 exposed by mesa-etching (S40). Here, the term 'dry etching' may be understood as a concept including reactive ion etching, reactive radical etching, and sputter etching. Accordingly, the conductive layer 140 may serve as a mask pattern for forming uneven portions on the first conductivity-type semiconductor layer 110, and an upper surface of the first conductivity-type semiconductor layer 110 may be partially etched to thereby have the uneven portions (u) formed thereon.

In more detail, the conductive layer 140 having a polycrystalline structure may be formed of a plurality of grains g. Here, a boundary between the grains g may be defined by a grain boundary b, and the grain boundary b corresponds to a portion in which etching is relatively easily performed as compared to the grains g. Therefore, when a dry etching process having superior etching efficiency in a vertical direction is performed on the conductive layer 140 so as to expose a portion of the first conductivity-type semiconductor layer 110, a region corresponding to the grain boundary b of the conductive layer 140, in the interface between the first conductivity-type semiconductor layer 110 and the conductive layer 140, may be first selectively exposed. Accordingly, amounts of time that different portions of the first conductivity-type semiconductor layer 110 are subject to etching may be different and thereby cause irregular etching of the surface of layer 110, such that the uneven portions (u) may be formed on the upper surface of the first conductivity-type semiconductor layer 110. Specifically, portions of the first conductivity-type semiconductor layer 110 located near grain boundaries b of the conductive layer 140 may be etched for a longer period of time than portions of the first conductivity-type semiconductor layer 110 located along grains g (and further from any boundaries b).

That is, different areas of the first conductivity-type semiconductor layer 110 may be selectively exposed for different periods of time to the dry etching process due to a difference in etching ratios between the grains g and the grain boundary b, such that the upper surface thereof may be partially etched and have the uneven portions (u) formed thereon.

According to the exemplary embodiment, sizes, density, and shapes of the uneven portions (u) formed on the first conductivity-type semiconductor layer 110 may be controlled by changing at least one of an average grain size and a thickness of the conductive layer 140.

The average grain size of the conductive layer 140 may be several micrometers (μm) to several tens of micrometers (μm), for example, more than about 1 μm, but is not limited thereto. In one example, the average grain size is from about 1 μm to about 90 μm.

The average grain size of the conductive layer 140 may be changed depending on an average grain size of a deposition source used at the time of depositing the conductive layer 140.

Figure 4A:
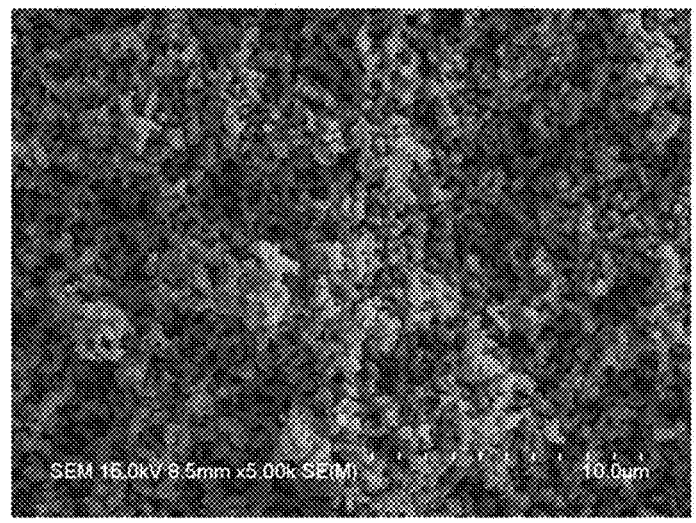
FIGS. 4A and 4B are scanning electron micrograph (SEM) photographs showing deposition sources used at the time of depositing a conductive layer.
Figure 4B:
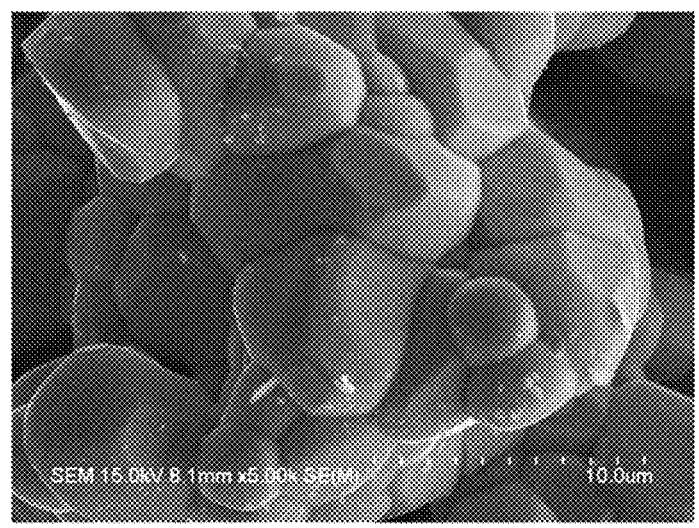
Figure 5A:
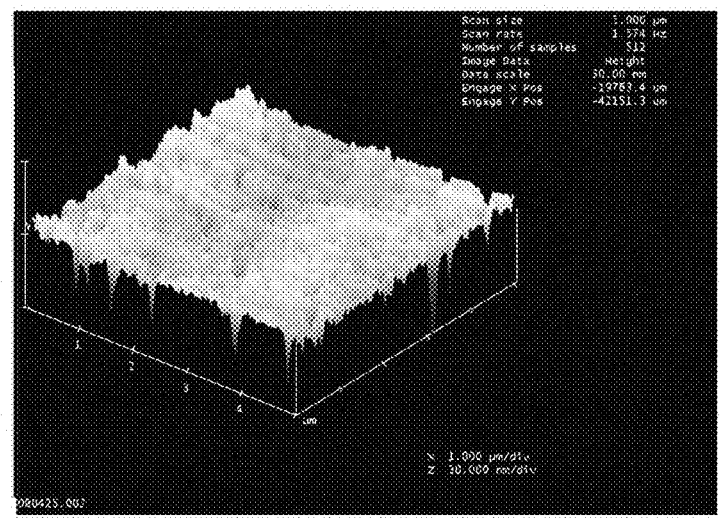
FIGS. 5A and 5B are simulation results illustrating uneven portions formed on a first conductive semiconductor layer in an example of using the deposition sources of FIGS. 4A and 4B.
Figure 5B:
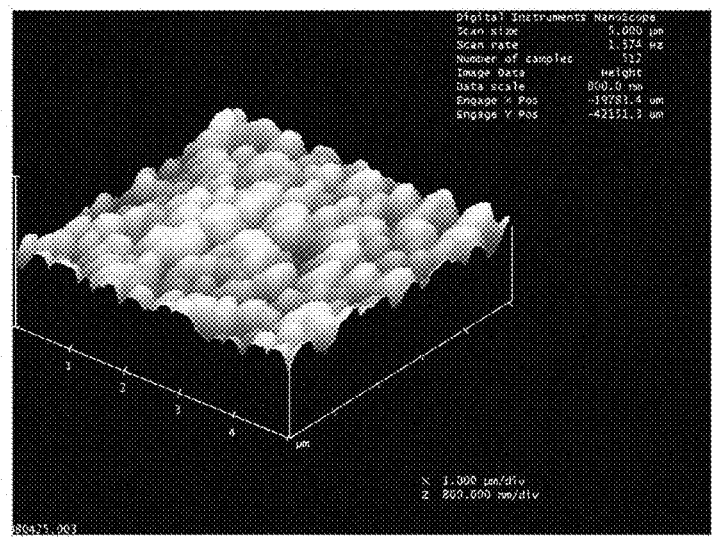

FIGS. 4A and 4B are scanning electron micrograph (SEM) photographs showing deposition sources used at the time of depositing the conductive layer 140, and in this case, ITO is employed in the deposition sources. FIGS. 5A and 5B are simulation results respectively illustrating uneven portions (u) formed on the first conductive semiconductor layer 110 in the case of dry etching the conductive layer 140 after the conductive layer 140 is formed using the deposition sources of FIGS. 4A and 4B. Referring to FIGS. 5A and 5B, it may be confirmed that the smaller the average grain size of the conductive layer 140, the denser the uneven portions (u) formed on the first conductive semiconductor layer 110. Conversely, the larger the average grain size of the conductive layer 140, the less dense the uneven portions (u) formed on the first conductive semiconductor layer 110.

In the exemplary embodiment, the thickness of the conductive layer 140 may be determined within a range less than about 2000 Å.

Figure 6:
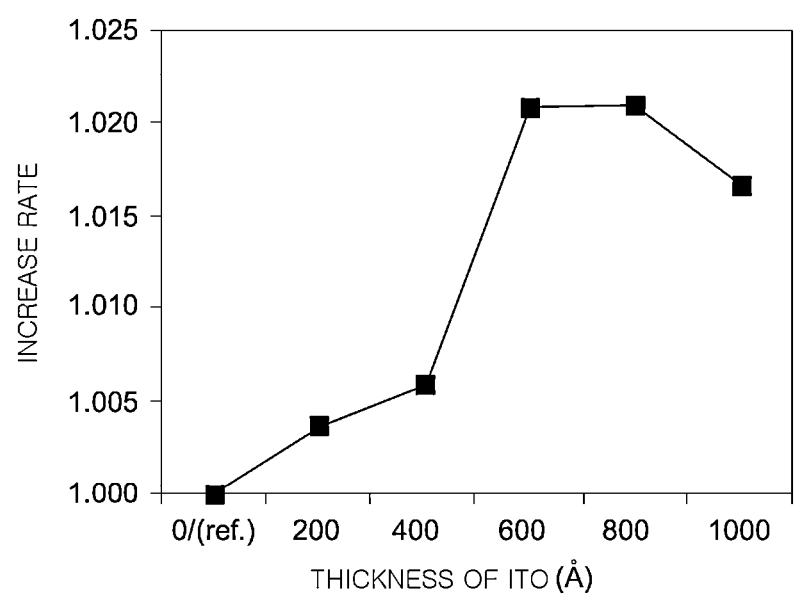
FIG. 6 is a graph illustrating a rate of increase in light extraction of the semiconductor light emitting device depending on a thickness of the conductive layer.

FIG. 6 is a graph illustrating a rate of increase in light extraction of the semiconductor light emitting device depending on the thickness $t_a$ of the conductive layer 140. ITO is employed for the conductive layer 140.

In general, ITO has characteristics by which etching is rapidly undertaken as compared to a material used for a semiconductor layer (for example, gallium nitride). Thus, in the case of using a transparent conductive oxide layer (for example, ITO) as the conductive layer 140, the conductive layer 140 may be formed to have a predetermined thickness so that it remains as a mask pattern while an intended size of uneven portions are formed on the first conductivity-type semiconductor layer 110. For example, referring to FIG. 6, in the case of a light emitting device in which the conductive layer 140 is formed to have a thickness of about 600 Å to about 800 Å and is then subjected to dry etching, light extraction efficiency may be increased by 2% or more as compared to a light emitting device having no uneven portions formed thereon.

However, the thickness of the conductive layer 140 according to the exemplary embodiment is not limited to the stated range, and may be variously changed depending on characteristics of the uneven portions (u) to be formed on the first conductivity-type semiconductor layer 110.

Meanwhile, referring to FIG. 3E again, in the process of dry etching the region of the conductive layer 140 formed on the portion of the first conductivity-type semiconductor layer 110 exposed by mesa-etching, fragments of an etched material, for example, fragments generated by etching the conductive layer 140 or fragments generated by etching the first conductivity-type semiconductor layer 110, may be adhered to the lateral surface of the mesa structure, for example, to the active layer 130 or the second conductivity-type semiconductor layer 120, thereby causing an electrical short circuit of the device (refer to arrows shown in FIG. 3E). However, in the exemplary embodiment, since the passivation layer P is formed before the etching of the conductive layer 140, an undesirable electrical short circuit may be prevented.

In addition, in order to enable the current applied from the second electrode unit 120a to be effectively dispersed over the entire surface of the second conductivity-type semiconductor layer 120, the region of the conductive layer 140 formed on the second conductivity-type semiconductor layer 120 may not be removed. In this case, prior to the dry etching of the conductive layer 140 after the conductive layer 140 is formed, a dry etching mask PR may be disposed on the region of the conductive layer 140 formed on the second conductivity-type semiconductor layer 120 in advance of the dry etching step.

Figure 3F:
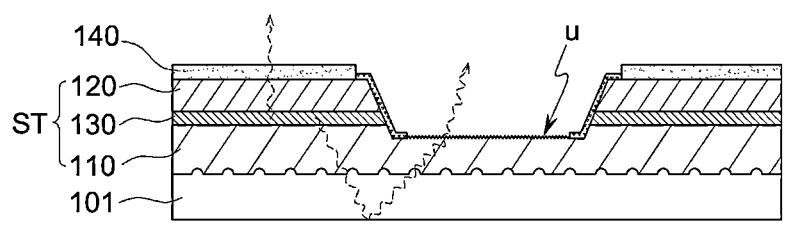

FIG. 3F illustrates a cross-section of the semiconductor light emitting device in a state in which the process has been completed. As illustrated in FIG. 3F, the uneven portions (u) may be provided on the first conductivity-type semiconductor layer 110, such that light generated in the active layer 130 may be easily, externally discharged through the uneven surface of the first conductivity-type semiconductor layer 110. Here, when the first and second electrode parts 110a and 120a are formed to be electrically connected to the first and second conductivity-type semiconductor layers 110 and 120, respectively, the semiconductor light emitting device 100 as illustrated in FIG. 1 may be obtained.

According to the manufacturing method of the present exemplary embodiment, in the forming of the uneven portions (u) on the first conductivity-type semiconductor layer 110, after the conductive layer 140 is entirely deposited on the portion of the first conductivity-type semiconductor layer 110 exposed by mesa-etching as well as on the second conductivity-type semiconductor layer 120, the conductive layer 140 formed on the first conductivity-type semiconductor layer 110 may be used as a mask pattern for forming the uneven portions (u). Thus, a separate mask formation process for forming uneven portions is unnecessary—thereby providing for a simplified fabrication process.

Hereinafter, with reference to FIG. 7 and FIGS. 8A and 8B, a method of manufacturing a semiconductor light emitting device according to a modified exemplary embodiment of the present disclosure will be described.

Figure 7:
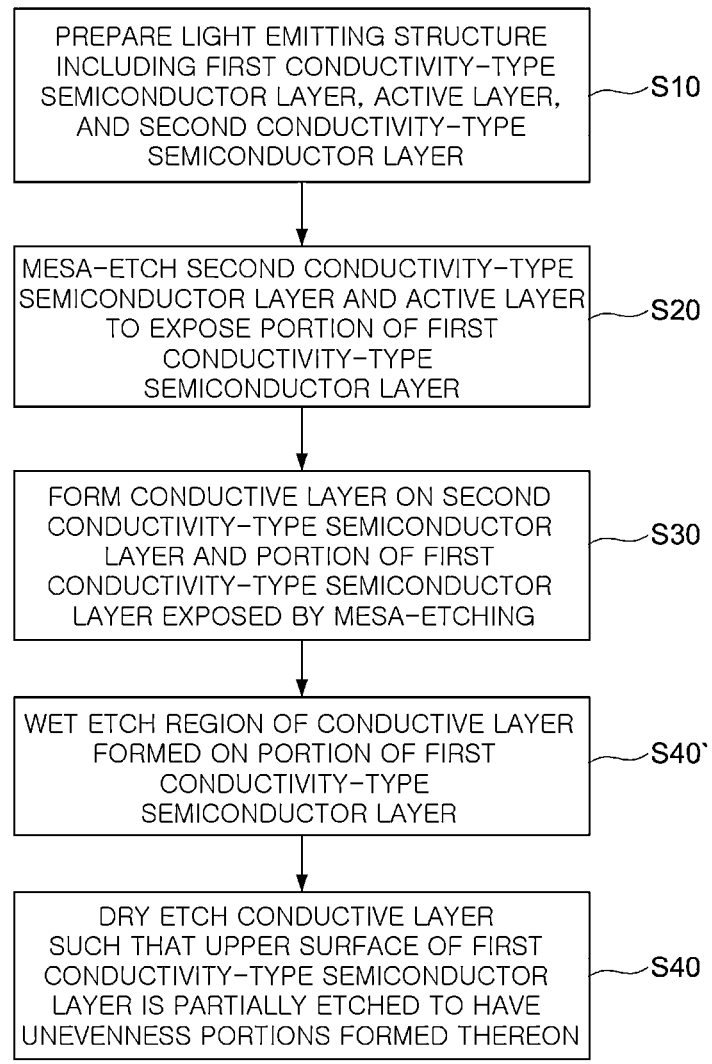
FIG. 7 is a flow chart describing steps of a method of manufacturing a semiconductor light emitting device according to another exemplary embodiment of the present disclosure.

FIG. 7 is a flow chart describing a method of manufacturing a semiconductor light emitting device according to another exemplary embodiment of the present disclosure. FIGS. 8A and 8B are cross-sectional views of the semiconductor light emitting device in various steps of the manufacturing process according to the exemplary embodiment of FIG. 7.

Referring to FIG. 7, the manufacturing method according to another exemplary embodiment may further include wet etching the region of the conductive layer 140 formed on the first conductivity-type semiconductor layer 110 (S40'). The step S40' is performed prior to the dry etching of the conductive layer 140 (S40) and after the conductive layer 140 is formed on the second conductivity-type semiconductor layer 120 and the portion of the first conductivity-type semiconductor layer 110 exposed by mesa-etching (S30).

Figure 8A:
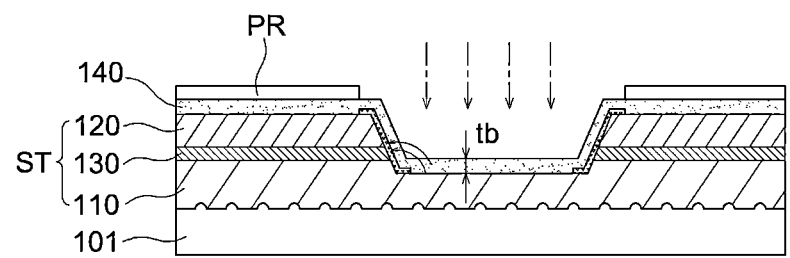
FIGS. 8A and 8B are cross-sectional views of the semiconductor light emitting device in various steps of a manufacturing process, according to the exemplary embodiment of FIG. 7.

FIG. 8A illustrates a cross-section of the semiconductor light emitting device in a state in which the following steps have been completed: (a) preparing of the light emitting structure ST including the first conductivity-type semiconductor layer 110, the active layer 130, and the second conductivity-type semiconductor layer 120 (S10), (b) the mesa-etching of the second conductivity-type semiconductor layer 120 and the active layer 130 to expose a portion of the first conductivity-type semiconductor layer 110 (S20), and (c) the forming of the conductive layer 140 on the portion of the first conductivity-type semiconductor layer 110 exposed by mesa-etching and on the second conductivity-type semiconductor layer 120 (S30). Here, prior to the forming of the conductive layer 140 (S30), the passivation layer P may be formed on the lateral surface of the mesa structure exposed by mesa-etching.

Thereafter, as illustrated in FIG. 8A, wet etching is performed on the region of the conductive layer 140 formed on the first conductivity-type semiconductor layer 110 (S40'). In this case, wet etching may be performed such that the region of the conductive layer 140 formed on the first conductivity-type semiconductor layer 110 is not completely removed and remains at least in part. To this end, in the forming of the conductive layer 140 (S30), the conductive layer 140 may be formed to have a thickness $t_b$ larger than the thickness $t_a$ of the conductive layer 140 formed according to the foregoing exemplary embodiment of FIGS. 3A through 3F ($t_b > t_a$). However, the present disclosure is not limited thereto.

Figure 8B:
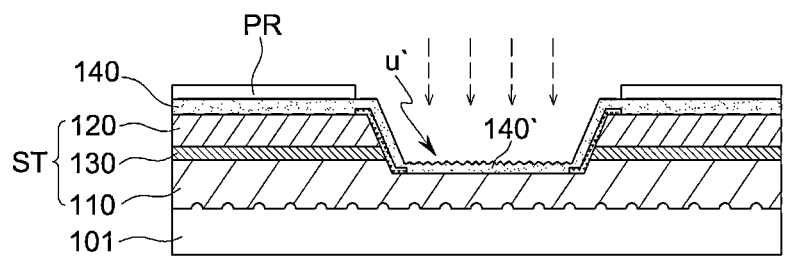

An upper surface of a conductive layer 140' upon which wet etching has been completed may have irregular surface uneven portions (u') as illustrated in FIG. 8B. Then, by dry etching the conductive layer 140' (S40), the upper surface of the first conductivity-type semiconductor layer 110 may be partially etched to form the uneven portions (u) as illustrated in FIG. 1. In this case, the uneven portions (u) of the first conductivity-type semiconductor layer 110 may be obtained in a pattern corresponding to that of the surface uneven portions (u') formed on the conductive layer 140 by the wet etching.

That is, unlike in the foregoing embodiment in which the grain size or the thickness of the conductive layer 140 serving as a mask pattern determined characteristics of the uneven portions (u) formed on the first conductivity-type semiconductor layer 110, the present exemplary embodiment is understood to provide a method for controlling the characteristics of the uneven portions (u) of the first conductivity-type semiconductor layer 110 by changing a surface shape (for example, surface uneven portions) of the conductive layer 140 prior to performing the dry etching.

The characteristics of the surface uneven portions (u') formed on the conductive layer 140 may vary depending on a time during which wet etching is performed on the conductive layer 140.

Table 1 shows experimental data describing roughness (unit: RMS) of the uneven portions (u) formed on the first conductivity-type semiconductor layer 110 and variations in luminance of the light emitting device, depending on variations in times for which wet etching was performed on the conductive layer 140.

TABLE 1

| Time (min:sec) | Roughness(RMS: nm) | Luminance(cd) |
| --- | --- | --- |
| 2:00 | 4 | 1.98 |
| 2:30 | 69 | 2.006 |
| 3:00 | 80 | 2.001 |
| 3:30 | 41 | 1.981 |
| 4:00 | 5 | 1.982 |

Referring to Table 1, the surface shape of the conductive layer 140 was changed by appropriately controlling the length of time periods for performing wet etching and accordingly, it may be confirmed that roughness of the uneven portions (u) of the first conductivity-type semiconductor layer 110 and the consequent luminance of the light emitting device could be controlled.

Meanwhile, in the exemplary embodiment, the etching mask PR may be disposed on the region of the conductive layer 140 formed on the second conductivity-type semiconductor layer 120, prior to the wet etching. However, the present disclosure is not limited thereto and, in some examples, wet etching may be performed on the region of the conductive layer 140 formed on the second conductivity-type semiconductor layer 120 during a wet etching process. In this case, predetermined surface uneven portions (u') may be formed on a region of the conductive layer 140 formed on the second conductivity-type semiconductor layer 120, such that light extraction efficiency may be improved.

Hereinafter, with reference to FIG. 9 and FIGS. 10A through 10D, a method of manufacturing a semiconductor light emitting device according to another modified exemplary embodiment of the present disclosure will be described.

Figure 9:
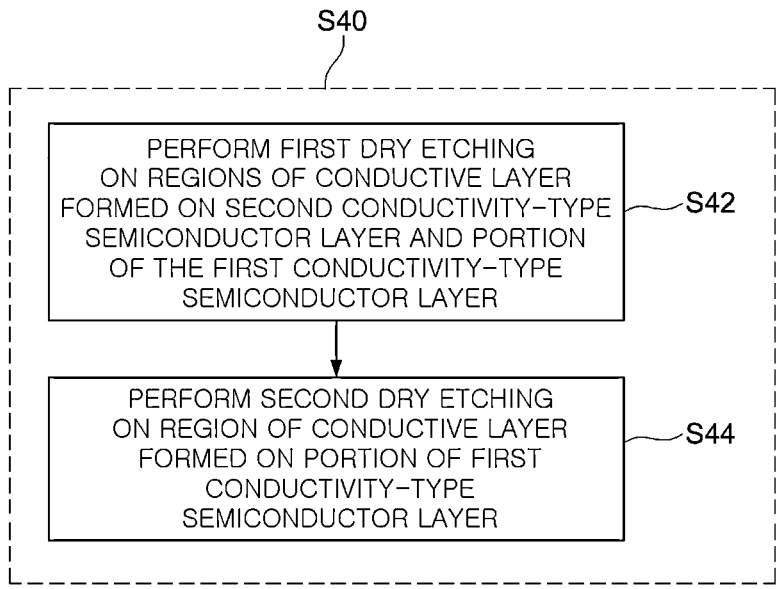
FIG. 9 is a flow chart describing steps of a method of manufacturing a semiconductor light emitting device according to another exemplary embodiment of the present disclosure.

FIG. 9 is a flow chart describing a method of manufacturing a semiconductor light emitting device according to another exemplary embodiment of the present disclosure. FIGS. 10A through 10D are cross-sectional views of the semiconductor light emitting device in various steps of the manufacturing process according to the exemplary embodiment of FIG. 9.

Referring to FIG. 9 together with FIG. 2, in another exemplary embodiment, dry etching the region of a conductive layer such that the upper surface of the first conductivity-type semiconductor layer 110 may be partially etched to have the uneven portions (u) thereon (S40) may include performing a first dry etching step (S42) and performing a second dry etching step (S44). This will be described in detail with reference to FIGS. 10A through 10D.

Figure 10A:
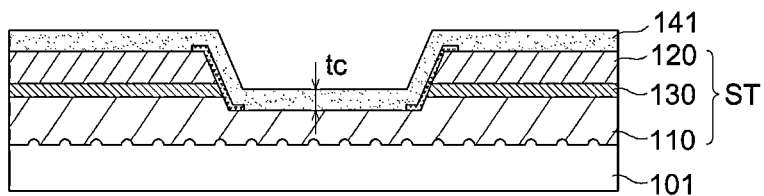
FIGS. 10A through 10D are cross-sectional views of the semiconductor light emitting device in various steps of a manufacturing process, according to the exemplary embodiment of FIG. 9.

FIG. 10A illustrates a cross-section of the semiconductor light emitting device in a state in which the following steps have been completed: (a) preparing of the light emitting structure ST including the first conductivity-type semiconductor layer 110, the active layer 130, and the second conductivity-type semiconductor layer 120 (S10), (b) the mesa-etching of the second conductivity-type semiconductor layer 120 and the active layer 130 to expose a portion of the first conductivity-type semiconductor layer 110 (S20), and (c) the forming of the conductive layer 141 on the portion of the first conductivity-type semiconductor layer 110 exposed by mesa-etching and on the second conductivity-type semiconductor layer 120 (S30). In a similar manner to that of the foregoing embodiments, prior to the forming of the conductive layer 141 (S30), the passivation layer P may be formed on the lateral surface of the mesa structure exposed by mesa-etching.

Figure 10B:
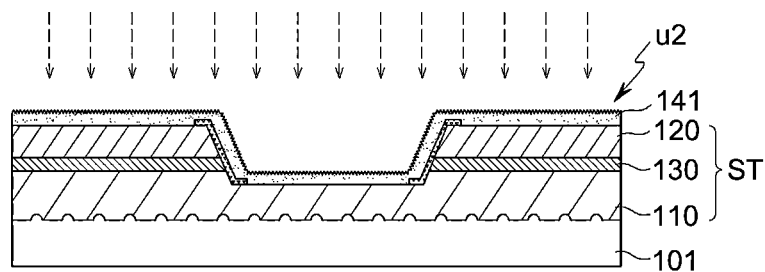

Next, as illustrated in FIG. 10B, a first dry etching step may be performed (S42). The first dry etching step may be performed both on a region of the conductive layer 141 formed on the second conductivity-type semiconductor layer 120 and on the region of the conductive layer 141 formed on the portion of the first conductivity-type semiconductor layer 110. The first dry etching step may be performed such that the region of the conductive layer 141 formed on the second conductivity-type semiconductor layer 120 is not completely removed and remains at least in part. Thus, an upper surface of the region of the conductive layer 141 formed on the second conductivity-type semiconductor layer 120 may be partially etched to have uneven portions ($u_2$) formed on a surface thereof. In this case, the conductive layer 141 may be formed in step (S30) to have a thickness $t_o$ larger than the thickness $t_o$ of the conductive layer 140 formed according to the foregoing exemplary embodiment of FIGS. 3A through 3F ($t_c > t_a$). However, the present disclosure is not limited thereto.

Figure 10C:
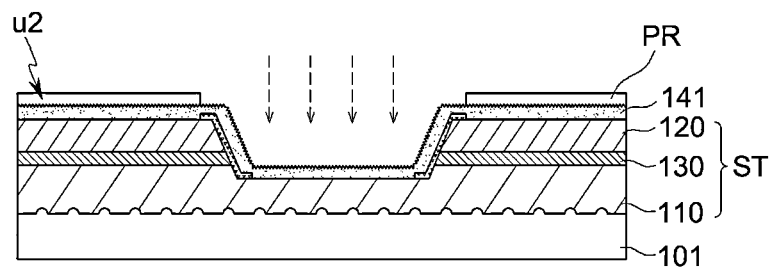

Next, as illustrated in FIG. 10C, a second dry etching step may be performed only on the region of the conductive layer 141 formed on the first conductivity-type semiconductor layer 110 (S44). The second dry etching may be performed until the region of the conductive layer 141 formed on the first conductivity-type semiconductor layer 110 is completely removed and does not remain on the layer 110. In this case, different parts of the first conductivity-type semiconductor layer 110 may be exposed to the dry etching process for different periods of time during the second dry etching step due to a difference in etching ratios between grains and grain boundaries forming the conductive layer 141, such that the upper surface thereof may be partially etched and have uneven portions ($u_1$) formed thereon (please refer to FIG. 10D).

In this case, the region of the conductive layer 141 formed on the second conductivity-type semiconductor layer 120 may remain. To this end, prior to the performing of the second dry etching step and after the first dry etching step, the dry etching mask PR may be disposed on the region of the conductive layer 141 formed on the second conductivity-type semiconductor layer 120.

Figure 10D:
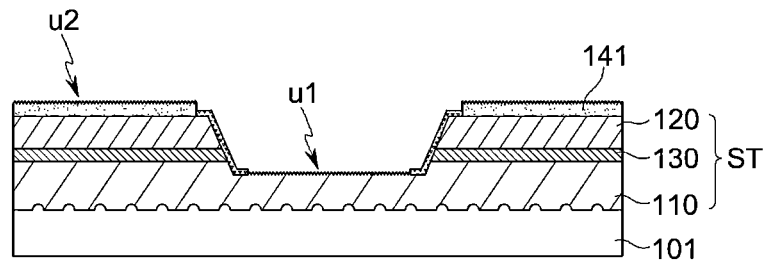

FIG. 10D illustrates a cross-section of the semiconductor light emitting device in a state in which the process has been completed. According to the exemplary embodiment, the uneven portions ($u_1$) may be provided on the region of the first conductivity-type semiconductor layer 110 exposed by the etching and the uneven portions ($u_2$) may be provided on the region of the conductive layer 141 formed on the second conductivity-type semiconductor layer 120. Accordingly, light generated from the active layer 130 may be more easily emitted to the outside through both the uneven surface of the first conductivity-type semiconductor layer 110 and the uneven surface of the conductive layer 141 disposed on the second conductivity-type semiconductor layer 120.

Hereinafter, with reference to FIGS. 11A through 11D, a method of manufacturing a semiconductor light emitting device according to another modified exemplary embodiment of the present disclosure will be described.

FIGS. 11A through 11D are cross-sectional views of a semiconductor light emitting device 200 in various steps of the manufacturing process according to another exemplary embodiment of the present disclosure.

Figure 11A:
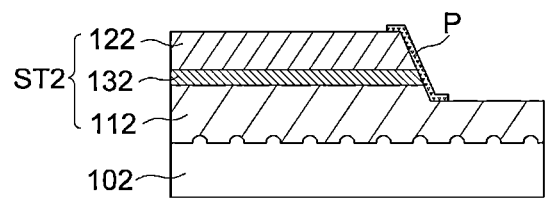
FIGS. 11A through 11D are cross-sectional views of a semiconductor light emitting device in various steps of a manufacturing process, according to another exemplary embodiment of the present disclosure.

FIG. 11A illustrates a cross-section of the semiconductor light emitting device in a state in which the following step has been completed: (a) preparing of a light emitting structure ST2 on a substrate 102 (S10), and (b) mesa-etching of a second conductivity-type semiconductor layer 122 and an active layer 132 to expose a portion of a first conductivity-type semiconductor layer 112 (S20). Here, the passivation layer P may be formed on the lateral surface of the mesa structure exposed by mesa-etching. As described above, the passivation layer P may prevent an electrical short circuit of the device that may be generated in a process of etching a region of a conductive layer 142 formed on the first conductivity-type semiconductor layer 112.

In the exemplary embodiment, the portion of the first conductivity-type semiconductor layer 112 exposed by the mesa-etching is illustrated as being disposed in an edge region, on an upper surface of the light emitting structure ST2. However, the present disclosure is not limited thereto and the portion exposed may be in a central portion of the layer 112.

Figure 11B:
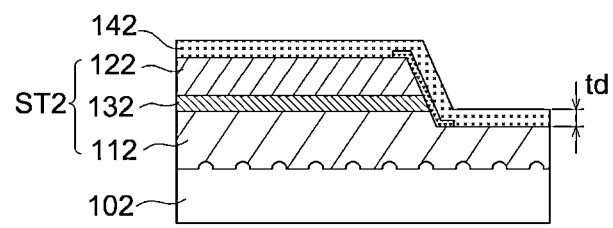

Next, as illustrated in FIG. 11B, the conductive layer 142 may be formed on the second conductivity-type semiconductor layer 122 and on the portion of the first conductivity-type semiconductor layer 112 exposed by the mesa-etching. The conductive layer 142 may be a reflective metal layer, unlike in the foregoing embodiments. The reflective metal layer may include a highly reflective material, for example, a material containing at least one of aluminum (Al) and silver (Ag). The conductive layer 142 may be formed to have a thickness $t_d$ of about 20 Å to about 100 Å.

Figure 11C:
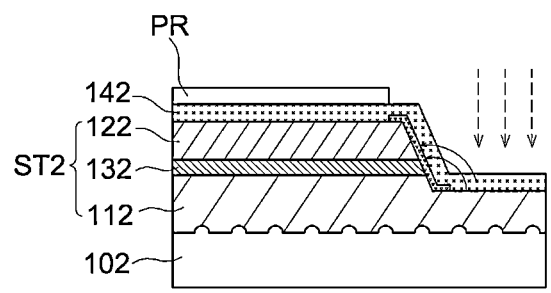

Next, as illustrated in FIG. 11C, dry etching may be performed on a region of the conductive layer 142 formed of the reflective metal layer on the portion of the first conductivity-type semiconductor layer 112 exposed by the mesa-etching. In this case, the dry etching may be performed until the region of the conductive layer 142 formed on the portion of the first conductivity-type semiconductor layer 112 is completely removed and does not remain. By doing so, an upper surface of the first conductivity-type semiconductor layer 112 may be partially etched to have the uneven portions (u) formed thereon.

Meanwhile, a region of the conductive layer 142 formed on the second conductivity-type semiconductor layer 122 may remain thereon. To this end, prior to the performing of the dry etching and after the forming of the conductive layer 142, the dry etching mask PR may be disposed on the region of the conductive layer 142 formed on the second conductivity-type semiconductor layer 122.

Thereafter, a second conductive layer 143 may be formed on the region of the conductive layer 142 formed on the second conductivity-type semiconductor layer 122. The second conductive layer 143 may be formed of the same material as that of the conductive layer 142, but is not limited thereto and can be formed of a different material than the conductive layer 142.

Then, first and second electrode parts 112a and 122a may be formed to be electrically connected to the first and second conductivity-type semiconductor layers 112 and 122, respectively, and may also be connected to first and second conductive bumps 113 and 123, respectively.

Figure 11D:
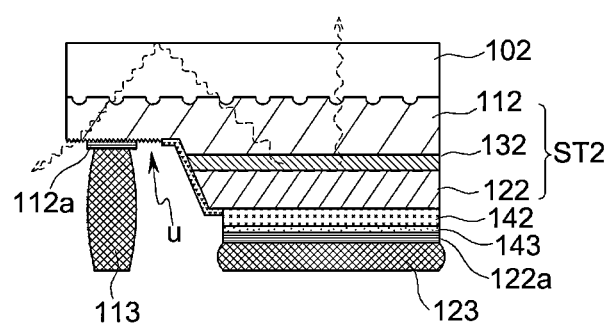

FIG. 11D illustrates a cross-section of the semiconductor light emitting device in a state in which the process has been completed. Referring to FIG. 11D, due to the uneven portions (u) formed on the first conductivity-type semiconductor layer 112, an incident angle of light at an interface between an external material (the air) and the first conductivity-type semiconductor layer 112 may be variously formed and light generated in the active layer 132 may be easily externally emitted, without being trapped within the device.

Figure 12:
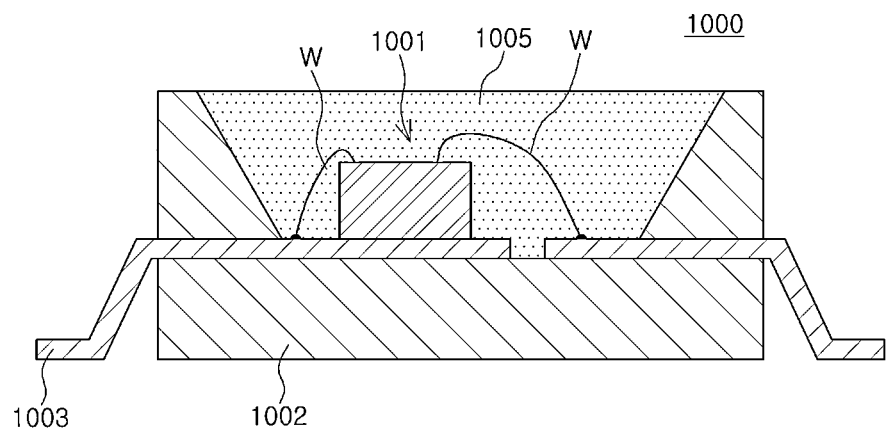
FIGS. 12 and 13 respectively illustrate examples of applying the semiconductor light emitting device according to the exemplary embodiment of the present disclosure to a package.
Figure 13:
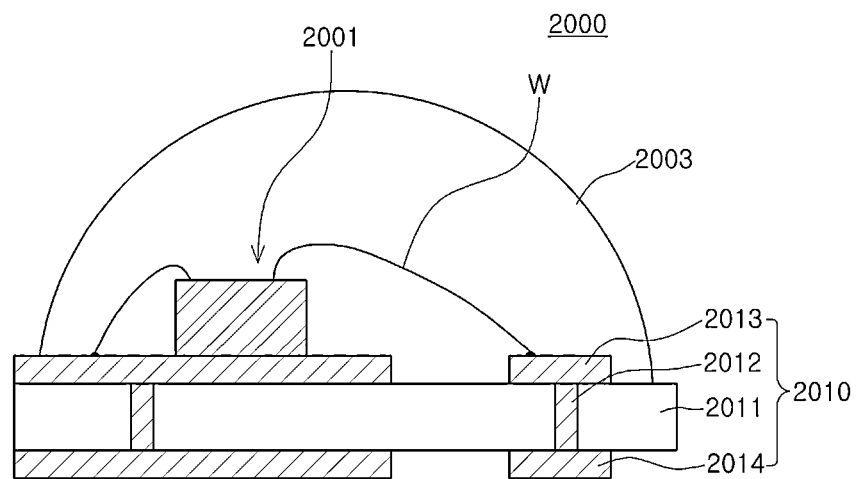

FIGS. 12 and 13 are views respectively illustrating an example of packages including the semiconductor light emitting device 100 or 200 according to the exemplary embodiment of the present disclosure.

Referring to FIG. 12, a semiconductor light emitting device package 1000 includes a light source 1001, a package body 1002, and a pair of lead frames 1003. The light source 1001 may be mounted on the lead frame 1003 to be electrically connected thereto via a wire W. According to exemplary embodiments, the light source 1001 may be mounted on another portion of the package 1000 rather than the lead frame 1003, for example, on the package body 1002. The package body 1002 may have a cup shape in order to improve light reflection efficiency, and such a reflective cup may be filled with a sealing part 1005 including a light transmissive material in order to encapsulate the light source 1001 and the wire W. In the exemplary embodiment, the light source 1001 may include the semiconductor light emitting devices 100 and/or 200 described in the foregoing embodiments.

Referring to FIG. 13, a semiconductor light emitting device package 2000 includes a light source 2001, a mounting board 2010, and a sealing part 2003. In addition, a wavelength conversion part may be formed on upper and side surfaces of the light source 2001. The light source 2001 may be mounted on the mounting board 2010 and electrically connected thereto through a wire W.

The mounting board 2010 may include a substrate body 2011, an upper surface electrode 2013, and a lower surface electrode 2014. In addition, the mounting board 2010 may also include a through electrode 2012 connecting the upper surface electrode 2013 and the lower surface electrode 2014. The mounting board 2010 may be provided as a board such as a PCB, an MCPCB, an MPCB, an FPCB, or the like, and a structure thereof may be used in various manners.

The wavelength conversion part may include fluorescent materials or quantum dots. The sealing part 2003 may have a convex lens shape in which an upper surface thereof is upwardly convex. Alternatively, the sealing part 2003 may have a concave lens shape according to embodiments, whereby an orientation angle of light emitted through an upper surface of the sealing part 2003 may be controlled.

In the exemplary embodiment, the light source 2001 may include the semiconductor light emitting devices 100 and/or 200 described in the foregoing embodiments.

Figure 14:
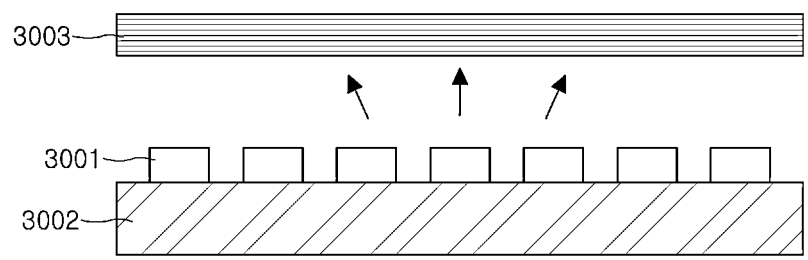
FIGS. 14 and 15 respectively illustrate examples of applying the semiconductor light emitting device according to the exemplary embodiment of the present disclosure to a backlight part.
Figure 15:
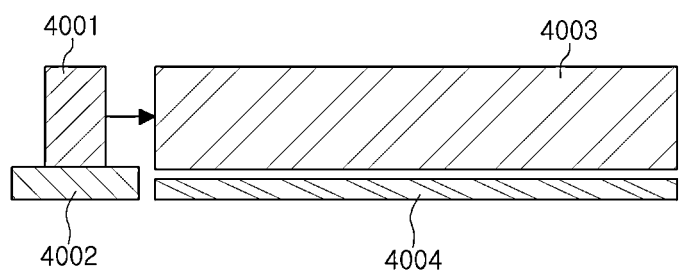

FIGS. 14 and 15 are views respectively illustrating an example of applying the semiconductor light emitting device 100 or 200 according to the exemplary embodiment of the present disclosure to a backlight part.

Referring to FIG. 14, a backlight unit 3000 includes a light source 3001 mounted on a substrate 3002 and at least one optical sheet 3003 disposed thereabove. The light source 3001 may be the semiconductor light emitting device package 1000 or 2000 having the structure above-described with reference to FIGS. 12 and 13 or a structure similar thereto. Alternatively, one of the semiconductor light emitting devices 100 and 200 according to the foregoing embodiments may be directly mounted on the substrate 3002 (so called a chip-on-board (COB) type).

The light source 3001 in the backlight unit 3000 of FIG. 14 emits light toward a liquid crystal display (LCD) device disposed thereabove. On the other hand, a light source 4001 mounted on a substrate 4002 in a backlight unit 4000 according to another embodiment illustrated in FIG. 15 emits light laterally and the emitted light is incident to a light guide plate 4003 such that the backlight unit 4000 may serve as a surface light source. The light that has passed through the light guide plate 4003 may be emitted upwardly and a reflective layer 4004 may be formed under a bottom surface of the light guide plate 4003 in order to improve light extraction efficiency.

Figure 16:
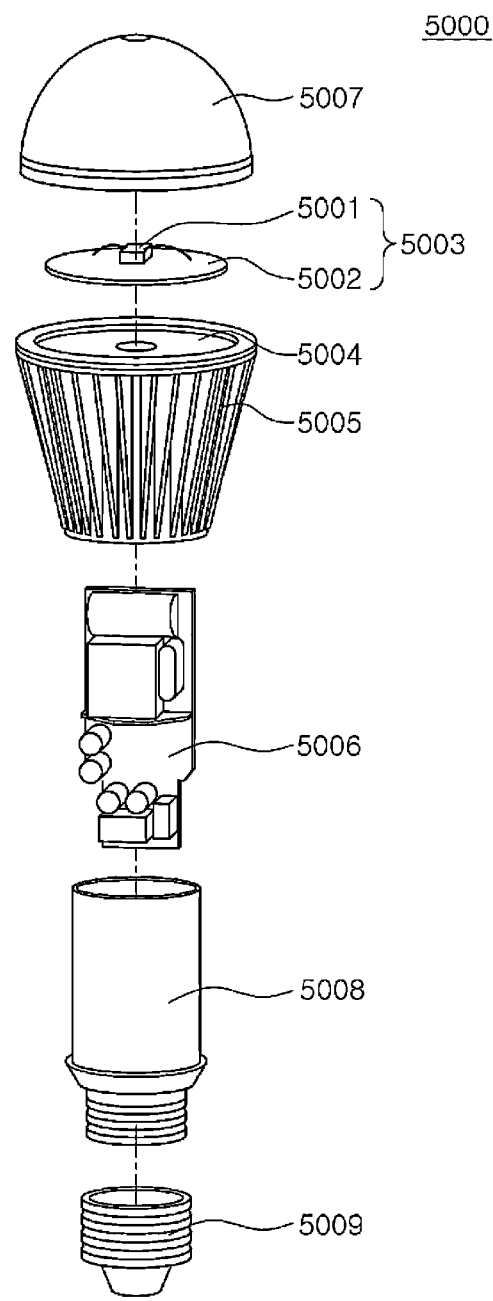
FIGS. 16 and 17 respectively illustrate examples of applying the semiconductor light emitting device according to the exemplary embodiment of the present disclosure to a lighting device.
Figure 17:
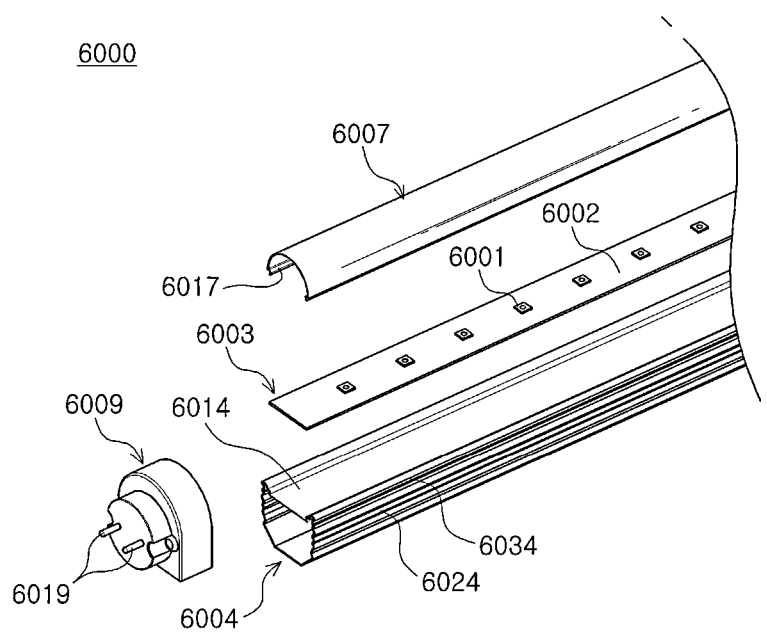

FIGS. 16 and 17 are exploded perspective views respectively illustrating a lighting device 5000 or 6000 to which the semiconductor light emitting device 100 or 200 according to the exemplary embodiment of the present disclosure is applied.

The lighting device 5000 may be a bulb-type lamp as illustrated in FIG. 16 and may have a shape similar to an incandescent lamp so as to be substituted with the incandescent lamp according to the related art, but is not limited to having such a shape. The lighting device 5000 may emit light having light characteristics (color and color temperature) similar to those of the incandescent lamp.

Referring to the exploded perspective view of FIG. 16, the lighting device 5000 includes a light emitting module 5003, a driving unit 5006, and an external connector unit 5009. In addition, exterior structures such as an external housing 5005, an internal housing 5008, and a cover unit 5007 may be additionally included. The light emitting module 5003 may include a light source 5001 and a circuit board 5002 having the light source 5001 mounted thereon. The present embodiment illustrates the case in which a single light source 5001 is mounted on the circuit board 5002; however, if necessary, a plurality of light sources may be mounted thereon. Here, the light source 5001 may be the semiconductor light emitting device 100 or 200, or the semiconductor light emitting device package 1000 or 2000 described in the foregoing embodiments.

In the lighting device 5000, the external housing 5005 may serve as a heat radiating part, and include a heat sink plate 5004 in direct contact with the light emitting module 5003 to improve the dissipation of heat. The cover unit 5007 may be disposed above the light emitting module 5003 and may have a convex lens shape. The driving unit 5006 may be disposed inside the internal housing 5008 and receive power from the external connector unit 5009 such as a socket structure. In addition, the driving unit 5006 may convert the received power into a current appropriate for driving the light source 5001 of the light emitting module 5003 and supply the converted current thereto. For example, the driving unit 5006 may include a rectifying part and a DC/DC converter.

The lighting device 6000 may be a bar-type lamp as illustrated in FIG. 17 and may have a shape similar to a fluorescent lamp so as to be substituted with the fluorescent lamp according to the related art, but is not limited to having such a shape. The lighting device 6000 may emit light having light characteristics similar to those of the fluorescent lamp.

Referring to the exploded perspective view of FIG. 17, the lighting device 6000 according to the exemplary embodiment may include a light source module 6003, a body part 6004, and a terminal part 6009, and may further include a cover part 6007 covering the light source module 6003.

The light source module 6003 may include a substrate 6002 and a plurality of light sources 6001 mounted on the substrate 6002. The light sources 6001 may be semiconductor light emitting devices 100 and/or 200, or the semiconductor light emitting devices package 1000 and/or 2000 described in the foregoing embodiments.

The body part 6004 may have the light source module 6003 mounted on one surface thereof to be fixed thereto. The body part 6004 may be a sort of support structure and include a heat sink. The body part 6004 may be formed of a material having high thermal conductivity so as to emit heat generated from the light source module 6003 outwardly. For example, the body part 6004 may be formed of a metal material, but is not limited thereto.

The body part 6004 may have an elongated bar shape corresponding to a shape of the substrate 6002 of the light source module 6003. The body part 6004 may have a recess 6014 formed in a surface thereof on which the light source module 6003 is mounted, the recess 6014 being capable of receiving the light source module 6003 therein.

A plurality of heat radiating fins 6024 for the radiation of heat may be formed on both outer side surfaces of the body part 6004 so as to protrude therefrom. In addition, catching grooves 6034 may be formed at both distal ends of the outer side surfaces disposed above the recess 6014, the catching grooves 6034 being extended in a length direction of the body part 6004. The cover part 6007, to be described later, may be coupled to the catching grooves 6034.

Both ends of the body part 6004 in the length direction may be opened and thus, the body part 6004 has a pipe shape having opened ends. The exemplary embodiment illustrates a structure of the body part 6004 in which both ends thereof are open, but is not limited thereto. For example, either or both ends of the body part 6004 may be closed.

The terminal part 6009 may be provided in at least one open end of the body part 6004 in the length direction and supply power to light source module 6003. The exemplary embodiment illustrates that both ends of the body part 6004 are opened and have respective terminal parts 6009 provided therein. However, the present disclosure is not limited thereto and for example, the terminal part 6009 may be provided in only one open end of the body part 6004.

The terminal parts 6009 may be respectively coupled to and cover the open ends of the body part 6004. Each of the terminal parts 6009 may include electrode pins 6019 outwardly protruded.

The cover part 6007 may be coupled to the body part 6004 and cover the light source module 6003. The cover part 6007 may be formed of a light transmissive material.

The cover part 6007 may have a curved semicircular surface to enable light to be generally externally irradiated in a uniform manner. In addition, a bottom surface of the cover part 6007 coupled to the body part 6004 may be provided with protrusions 6017 formed in the length direction of the cover part 6007 and engaged with the catching grooves 6034 of the body part 6004.

The exemplary embodiment illustrates that the cover part 6007 has a semicircular shape, but the cover part 6007 is not limited thereto. For example, the cover part 6007 may have a flat quadrangular shape and may also have other polygonal shapes. Such a shape of the cover part 6007 may be variously changed depending on a design of a lighting device from which light is irradiated.

Figure 18:
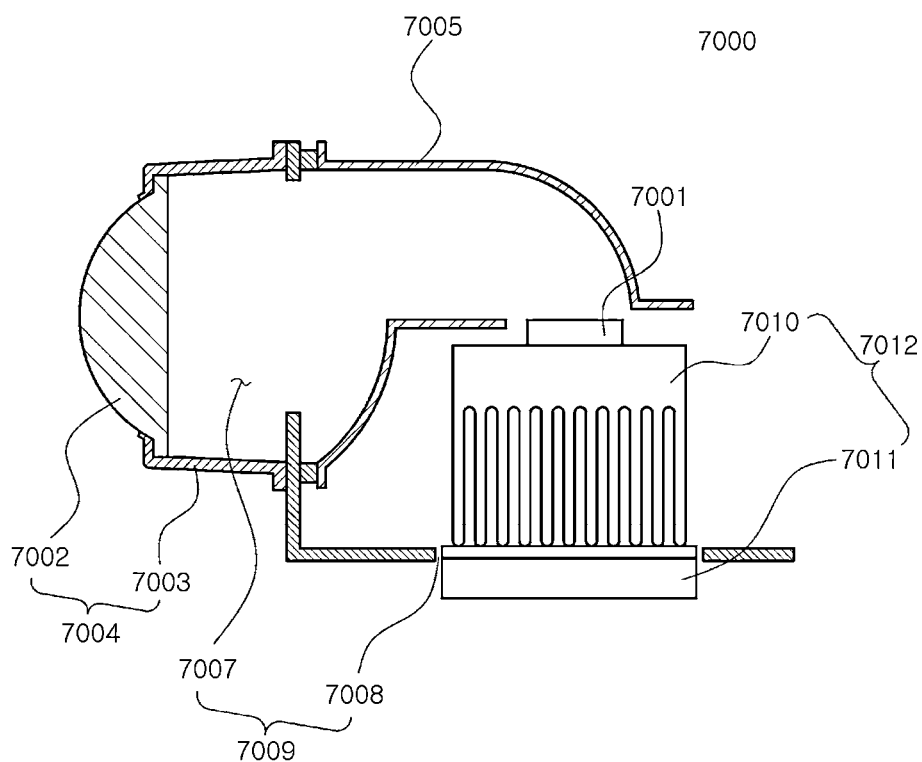
FIG. 18 illustrates an example of applying the semiconductor light emitting device according to the exemplary embodiment of the present disclosure to a headlamp.

FIG. 18 is a view illustrating an example of a headlamp including the semiconductor light emitting device 100 or 200 according to the exemplary embodiment of the present disclosure. Referring to FIG. 18, a headlamp 7000 used as a vehicle lighting element or the like may include a light source 7001, a reflective unit 7005, and a lens cover unit 7004, the lens cover unit 7004 including a hollow guide part 7003 and a lens 7002. The headlamp 7000 may further include a heat radiating unit 7012 dissipating heat generated by the light source 7001 outwardly. The heat radiating unit 7012 may include a heat sink 7010 and a cooling fan 7011 in order to effectively dissipate heat. In addition, the headlamp 7000 may further include a housing 7009 allowing the heat radiating unit 7012 and the reflective unit 7005 to be fixed thereto and supported thereby. One surface of the housing 7009 may be provided with a central hole 7008 into which the heat radiating unit 7012 is inserted to be coupled thereto. The other surface of the housing 7009 integrally connected to and bent in a direction perpendicular to the one surface of the housing 7009 may be provided with a forward hole 7007 such that the reflective unit 7005 may be disposed above the light source 7001. Accordingly, a forward side may be opened by the reflective unit 7005 and the reflective unit 7005 may be fixed to the housing 7009 such that the opened forward side corresponds to the forward hole 7007, whereby light reflected by the reflective unit 7005 disposed above the light source 7001 may pass through the forward hole 7007 to thereby be emitted outwardly. In the exemplary embodiment, the light source 7001 may include the semiconductor light emitting device 100 or 200, or the semiconductor light emitting device package 1000 or 2000 described in the foregoing embodiments.

As set forth above, according to exemplary embodiments of the present disclosure, a method of efficiently manufacturing a semiconductor light emitting device having improved external light extraction efficiency may be obtained.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a semiconductor light emitting device, the method comprising:
    mesa-etching a second conductivity-type semiconductor layer and an active layer to expose a portion of a first conductivity-type semiconductor layer in a light emitting structure having sequentially stacked the first conductivity-type semiconductor layer, the active layer, and the second conductivity-type semiconductor layer;
    forming a conductive layer on the second conductivity-type semiconductor layer and on the portion of the first conductivity-type semiconductor layer exposed by mesa-etching; and
    dry etching the conductive layer such that an upper surface of the first conductivity-type semiconductor layer is partially etched to have uneven portions thereon.

2. The method of claim 1, wherein in the dry etching of the conductive layer, the dry etching is performed on a region of the conductive layer formed on the portion of the first conductivity-type semiconductor layer in such a manner that different areas of the upper surface of the first conductivity-type semiconductor layer are selectively exposed for different periods of time to the dry etching process due to a difference in etching ratios between grains and grain boundaries forming the conductive layer.

3. The method of claim 1, wherein the dry etching of the conductive layer is performed such that the conductive layer formed on the portion of the first conductivity-type semiconductor layer is completely removed from the portion of the first conductivity-type semiconductor layer.

4. The method of claim 1, further comprising:
    disposing a dry etching mask on a region of the conductive layer formed on the second conductivity-type semiconductor layer, prior to the dry etching of the conductive layer and after the forming of the conductive layer.

5. The method of claim 1, further comprising:
    forming a passivation layer to cover a lateral surface of a mesa structure exposed by the mesa-etching, prior to the forming of the conductive layer and after the mesa-etching of the second conductivity-type semiconductor layer and the active layer.

6. The method of claim 5, wherein the passivation layer includes at least one material selected from a group consisting of silicon oxide, silicon nitride, and silicon oxynitride.

7. The method of claim 1, wherein the dry etching of the conductive layer includes:
performing a first dry etching on regions of the conductive layer formed on the second conductivity-type semiconductor layer and on the portion of the first conductivity-type semiconductor layer; and
performing a second dry etching on the region of the conductive layer formed on the portion of the first conductivity-type semiconductor layer in such a manner that the upper surface of the first conductivity-type semiconductor layer is partially etched to have the uneven portions formed thereon.

8. The method of claim 7, wherein the performing of the first dry etching is undertaken such that a surface of the region of the conductive layer formed on the second conductivity-type semiconductor layer is partially etched to have uneven portions formed thereon, and such that the region of the conductive layer formed on the second conductivity-type semiconductor layer remains on the second conductivity-type semiconductor layer following the first dry etching.

9. The method of claim 1, further comprising:
wet etching a region of the conductive layer formed on the portion of the first conductivity-type semiconductor layer, prior to the dry etching of the conductive layer and after the forming of the conductive layer.

10. The method of claim 9, wherein the wet etching is performed such that the region of the conductive layer formed on the portion of the first conductivity-type semiconductor layer remains on the first conductivity-type semiconductor layer following the wet etching.

11. The method of claim 1, wherein the conductive layer is a transparent conductive oxide layer.

12. The method of claim 11, wherein the conductive layer is formed to have a thickness of about 600 Å to about 800 Å.

13. The method of claim 1, wherein the conductive layer is a reflective metal layer.

14. The method of claim 13, wherein the conductive layer is formed to have a thickness of about 20 Å to about 100 Å.

15. A method of manufacturing a semiconductor light emitting device, the method comprising:
mesa-etching a light emitting structure including a sequential stack of a first conductivity-type semiconductor layer, an active layer, and a second conductivity-type semiconductor layer, to expose a portion of the first conductivity-type semiconductor layer;
forming a conductive polycrystalline layer on the exposed portion of the first conductivity-type semiconductor layer and the second conductivity-type semiconductor layer so as to form an interface between the first conductivity-type semiconductor layer and the conductive polycrystalline layer; and
dry etching the conductive polycrystalline layer such that the first conductivity-type semiconductor layer has uneven portions at the interface thereof.

16. A method of manufacturing a semiconductor light emitting device, the method comprising:
forming, on a surface of a light emitting structure including a first semiconductor layer, an active layer, and a second semiconductor layer, a conductive layer formed of a plurality of grains separated by grain boundaries; and
dry etching the conductive layer formed on the light emitting structure to expose at least a portion of the surface of the light emitting structure,
wherein areas of the exposed surface of the light emitting structure disposed near grain boundaries of the conductive layer are subject to the dry etching for a longer period of time than areas of the exposed surface of the light emitting structure disposed away from grain boundaries.

17. The method of claim 16, further comprising:
selecting an average grain size of the conductive layer prior to forming the conductive layer, wherein:
the dry etching produces uneven portions on the exposed surface of the light emitting structure, and
the average grain size is selected based on a desired density of the uneven portions produced on the exposed surface of the light emitting structure.

18. The method of claim 16, wherein:
the first semiconductor layer, the active layer, and the second semiconductor layer are sequentially stacked layers of the light emitting structure, and
the dry etching of the conductive layer comprises dry etching portions of the conductive layer that are formed directly on the first semiconductor layer of the light emitting structure so as to expose at least a portion of the first semiconductor layer of the light emitting structure.

19. The method of claim 16, wherein:
the conductive layer is formed both directly on portions of the first semiconductor layer and directly on portions of the second semiconductor layer, and
the dry etching of the conductive layer comprises:
performing a first dry etching step on both portions of the conductive layer formed directly on the first semiconductor layer and portions of the conductive layer formed directly on the second semiconductor layer, wherein at least part of the conductive layer remains on the first semiconductor layer and on the second semiconductor layer following completion of the first dry etching step; and
performing a second dry etching step only on portions of the semiconductor layer formed directly on the first semiconductor layer so as to expose at least part of the first semiconductor layer of the light emitting structure.

20. The method of claim 16, wherein the conductive layer is a transparent conductive oxide layer.

* * * * *